(12) United States Patent
Imamura et al.

(10) Patent No.: US 10,522,758 B2
(45) Date of Patent: Dec. 31, 2019

(54) INK FOR FORMING FUNCTIONAL LAYER, METHOD OF MANUFACTURING INK FOR FORMING FUNCTIONAL LAYER, AND METHOD OF MANUFACTURING ORGANIC ELECTRO-LUMINESCENCE ELEMENT

(71) Applicant: SEIKO EPSON CORPORATION, Tokyo (JP)

(72) Inventors: Koji Imamura, Shiojiri (JP); Masahiro Uchida, Chino (JP); Takuya Sonoyama, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 15/665,464

(22) Filed: Aug. 1, 2017

(65) Prior Publication Data

US 2017/0338413 A1 Nov. 23, 2017

Related U.S. Application Data

(63) Continuation of application No. 14/539,304, filed on Nov. 12, 2014, now Pat. No. 9,825,225.

(30) Foreign Application Priority Data

Nov. 19, 2013 (JP) .................. 2013-238595

(51) Int. Cl.
*H01L 51/00* (2006.01)
*C09D 11/30* (2014.01)
(Continued)

(52) U.S. Cl.
CPC .......... *H01L 51/0004* (2013.01); *C09D 11/02* (2013.01); *C09D 11/30* (2013.01);
(Continued)

(58) Field of Classification Search
CPC ............ H01L 51/0005; H01L 51/0032; H01L 51/0034; H01L 51/0035; H01L 51/0037;
(Continued)

(56) References Cited

U.S. PATENT DOCUMENTS

2003/0010252 A1* 1/2003 Arita ..................... C09D 11/30
                                                    106/31.27
2004/0137652 A1   7/2004 Ishii
(Continued)

FOREIGN PATENT DOCUMENTS

CN      102464915 A    5/2012
EP      2 557 898 A1   2/2013
(Continued)

OTHER PUBLICATIONS

Mar. 30, 2015 Extended Search Report issued in European Application No. 14193164.2.
(Continued)

*Primary Examiner* — Moazzam Hossain
*Assistant Examiner* — Stanetta D Isaac
(74) *Attorney, Agent, or Firm* — Oliff PLC

(57) ABSTRACT

An ink for forming a functional layer, which is used when any thin film layer among functional layers consisting of a plurality of thin film layers is formed, includes a functional layer forming material and a solvent for dissolving the functional layer forming material, and in which the number of particles of 0.5 μm or more is 7 or less in 10 ml of the ink for forming a functional layer.

6 Claims, 11 Drawing Sheets

(51) Int. Cl.
*H01L 51/56* (2006.01)
*H05B 33/10* (2006.01)
*C09D 11/02* (2014.01)
*C09D 11/50* (2014.01)
*C09D 11/52* (2014.01)
*H01L 51/50* (2006.01)
*H01L 27/32* (2006.01)

(52) U.S. Cl.
CPC .............. *C09D 11/50* (2013.01); *C09D 11/52* (2013.01); *H01L 51/0005* (2013.01); *H01L 51/56* (2013.01); *H05B 33/10* (2013.01); *H01L 27/3211* (2013.01); *H01L 51/504* (2013.01)

(58) Field of Classification Search
CPC ......... H01L 2251/56; H01L 2251/5307; H01L 2251/5315; H01L 2251/5323; H01L 2251/533; H01L 2251/5353; B32B 2457/206
See application file for complete search history.

(56) References Cited

U.S. PATENT DOCUMENTS

| | | |
|---|---|---|
| 2007/0167537 A1 | 7/2007 | Taguchi et al. |
| 2008/0233826 A1 | 9/2008 | Matsuda |
| 2010/0213827 A1 | 8/2010 | Yoshida et al. |
| 2010/0265307 A1 | 10/2010 | Linton et al. |
| 2011/0024668 A1 | 2/2011 | Chung et al. |
| 2012/0128890 A1 | 5/2012 | Mirchev |
| 2013/0043784 A1* | 2/2013 | Tanaka ................ H01L 51/0005 313/504 |
| 2015/0021587 A1 | 1/2015 | Mizukami et al. |
| 2015/0064828 A1 | 3/2015 | Watanabe et al. |

FOREIGN PATENT DOCUMENTS

| | | |
|---|---|---|
| JP | 2002/359073 A | 12/2002 |
| JP | 200795516 A | 4/2007 |
| JP | 2008268880 A | 11/2008 |
| JP | 2010/212354 A | 9/2010 |
| JP | 201238616 A | 2/2012 |
| JP | 201326164 A | 2/2013 |
| JP | 201362086 A | 4/2013 |
| WO | 2007/026579 A1 | 3/2007 |
| WO | 2009/084209 A1 | 7/2009 |
| WO | 2013/154076 A1 | 10/2013 |

OTHER PUBLICATIONS

Feb. 26, 2016 Office Action issued in U.S. Appl. No. 14/539,304.
Jul. 5, 2016 Office Action issued in U.S. Appl. No. 14/539,304.
Nov. 16, 2016 Office Action issued in U.S. Appl. No. 14/539,304.
Jul. 9, 2015 Office Action issued in U.S. Appl. No. 14/539,304.
Liquid Particle Sensor KS-41A, Product Catalog Rion Co., Ltd., (Aug. 30, 2019).

* cited by examiner

FIG. 8

| PANEL SPECIFICATION | PIXEL AREA ($\mu m^2$) | SIZE OF DS | | | ALLOWABLE DS $\phi$ ($\mu m$) | ALLOWABLE FOREIGN SUBSTANCE $\phi$ ($\mu m$) |
|---|---|---|---|---|---|---|
| | | 4 $\mu m\phi$ (12.6 $\mu m^2$) | 10 $\mu m\phi$ (78.5 $\mu m^2$) | 20 $\mu m\phi$ (314 $\mu m^2$) | | |
| TRIAL PRODUCT (3 Inch) | 27197 | 0.05% | 0.29% | 1.15% | 18.6 | 2.3 |
| 4K2K (55 Inch) | 11729 | 0.11% | 0.67% | 2.68% | 12.2 | 1.5 |
| 4K2K (42 Inch) | 6840 | 0.18% | 1.15% | 4.59% | 9.3 | 1.2 |
| 8K4K (55 Inch) | 2932 | 0.43% | 2.68% | 10.71% | 6.1 | 0.8 |

INK FOR FORMING FUNCTIONAL LAYER, METHOD OF MANUFACTURING INK FOR FORMING FUNCTIONAL LAYER, AND METHOD OF MANUFACTURING ORGANIC ELECTRO-LUMINESCENCE ELEMENT

This application is a Continuation of application Ser. No. 14/539,304, filed Nov. 12, 2014, which claims priority of Japanese Patent Application No. 2013-238595, filed Nov. 19, 2013. The entire contents of the prior applications are hereby incorporated by reference herein in their entirety.

BACKGROUND

1. Technical Field

The present invention relates to an ink for forming a functional layer, a method of manufacturing an ink for forming a functional layer, and a method of manufacturing an organic electro-luminescence element.

2. Related Art

As a method of forming a functional layer by using a solution including a functional layer forming material as an ink and applying the solution onto a film forming region to be solidified, a liquid droplet discharging method using an ink jet head capable of discharging an ink from a nozzle as a droplet is employed. By using the liquid droplet discharging method, it is possible to accurately arrange an ink with a required amount as a droplet in the film forming region and form a stable functional layer in a film shape.

As an example of the functional layer formed by such a liquid droplet discharging method, a wiring layer, a semi-conductive layer, a coloring layer in a color filter, a luminescence layer in a luminescence element, and the like are included.

When foreign substances (particles) are included in the solution (ink) including the functional layer forming material, the functional layer is formed in a state in which the foreign substances (the particles) are included in the film forming region, and thus a part in which an original function can not be obtained in the functional layer is generated.

Therefore, for example, in JP-A-2007-95516, an application liquid which is used when at least one layer among organic luminescence medium layers is formed by a wet film forming method and produced by dissolving or dispersing a forming material in a solvent, in which the number of particles of 0.5 µm or more included in the application liquid is 50 pieces/ml or less, is indicated.

In addition, for example, in JP-A-2013-26164, a method of manufacturing an organic electro-luminescence ink composition including a process of pressure-filtering a solution produced by dissolving a high molecular organic electro-luminescence material in an organic solvent with a filter having a hole diameter from 0.03 µm to 0.1 µm is disclosed. According to Example described in JP-A-2013-26164, even if the hole diameter of a filter is set to 0.05 µm, and the filtering pressure and the filtering speed are adjusted, the number of particles of 0.5 µm or more included in 10 ml of the organic electro-luminescence ink composition is 10. When converted into the number of particles in 1 ml of the ink composition, the number of particles of 0.5 µm or more is 1.

However, in a display apparatus having an electrically independent organic electro-luminescence element for each pixel, even if one layer among the organic luminescence medium layers is formed using the application liquid in JP-A-2007-95516 and the organic electro-luminescence ink composition in JP-A-2013-26164, the pixels including the foreign substances are easily counted as a defect when the size of a pixel which is the film forming region becomes fine. That is, there was a problem in which it becomes difficult to manufacture the display apparatus in good yield.

SUMMARY

The invention can be realized in the following forms or application examples.

Application Example

According to an application example, there is provided an ink for forming a functional layer, which is used when any thin film layer among functional layers consisting of a plurality of thin film layers is formed, including a functional layer forming material and a solvent for dissolving the functional layer forming material, and in which the number of particles of 0.5 µm or more is 7 or less in 10 ml of the ink for forming a functional layer.

According to the application example, since the size and the number of particles are controlled, if this ink for forming a functional layer is used, it is possible to form the thin film layer in good yield.

Moreover, as a method of specifying the size and the number of particles included in a liquid, a method using an in-liquid particle counter is included and it is considered that at least 10 ml is required as a volume of a sample in order to accurately measure. That is, it is preferable to specify the size and the number of particles by setting 10 ml to a unit.

In the ink for forming a functional layer described in the application example, it is preferable that the number of particles of 0.5 µm or more be less than 1 in 10 ml of the ink.

According to this configuration, even if a region on which the ink for forming a functional layer is applied is small, it is possible to form the thin film layer in which the occurrence of a defect is reduced.

Application Example

According to this application example, there is provided a method of manufacturing an ink for forming a functional layer which is used when any thin film layer among functional layers consisting of a plurality of thin film layers is formed, including measuring the size and the number of particles included in the ink for forming a functional layer per unit volume after mixing, selecting a hole diameter of a filter based on a result of the measuring, and filtering the ink for forming a functional layer using a filter having a hole diameter selected in the selecting, in which, in the selecting, a hole diameter of a filter is selected from a relation between a hole diameter of a filter and the number of particles having a size of 0.5 µm or more after filtering.

According to the application example, it is possible to manufacture the ink for forming a functional layer in which the size and the number of particles are properly controlled.

In the method of manufacturing an ink for forming a functional layer described in the application example described above, in the selecting, it is preferable to determine the hole diameter of the filter and the number of times of filtration so that the number of particles of 0.5 µm or more is 7 or less in 10 ml of the ink after filtering.

According to this method, it is possible to manufacture the ink for forming a functional layer in which the occurrence of a defect is further reduced.

Application Example

According to the application example, there is provided a method of manufacturing an organic electro-luminescence element provided with a functional layer consisting of a plurality of thin film layers between an anode and a cathode and having a luminescence function, including forming any thin film layer among the functional layers using the ink for forming a functional layer described in the application example described above.

Application Example

According to this application example, there is provided a method of manufacturing an organic electro-luminescence element provided with a functional layer consisting of a plurality of thin film layers between an anode and a cathode and having a luminescence function, including forming any thin film layer among the functional layers using an ink for forming a functional layer manufactured by the method of manufacturing the ink for forming a functional layer described in the application example described above.

According to these application examples, it is possible to reduce the occurrence of a defect resulting from the particles and manufacture the organic electro-luminescence element in good yield.

BRIEF DESCRIPTION OF THE DRAWINGS

The invention will be described with reference to the accompanying drawings, wherein like numbers reference like elements.

FIG. 8 is a table showing a proportion of an area in which the size of a dark spot (DS) occupies in a pixel area.

DESCRIPTION OF EXEMPLARY EMBODIMENTS

Hereinafter, description will be given of an embodiment in which the invention is embodied in accordance with drawings. Moreover, the used drawings are displayed by appropriately enlarging or reducing the size so as to become a state in which parts of description can be recognized.

Moreover, in the following aspects, for example, in a case where "on a substrate" is described, a case of arranging so as to contact on a substrate, a case of arranging on a substrate through another component, or a case of arranging so as to partially contact on a substrate and partially arranging on a substrate through another component is indicated.

Organic Electro-luminescence Apparatus

Figure 1:
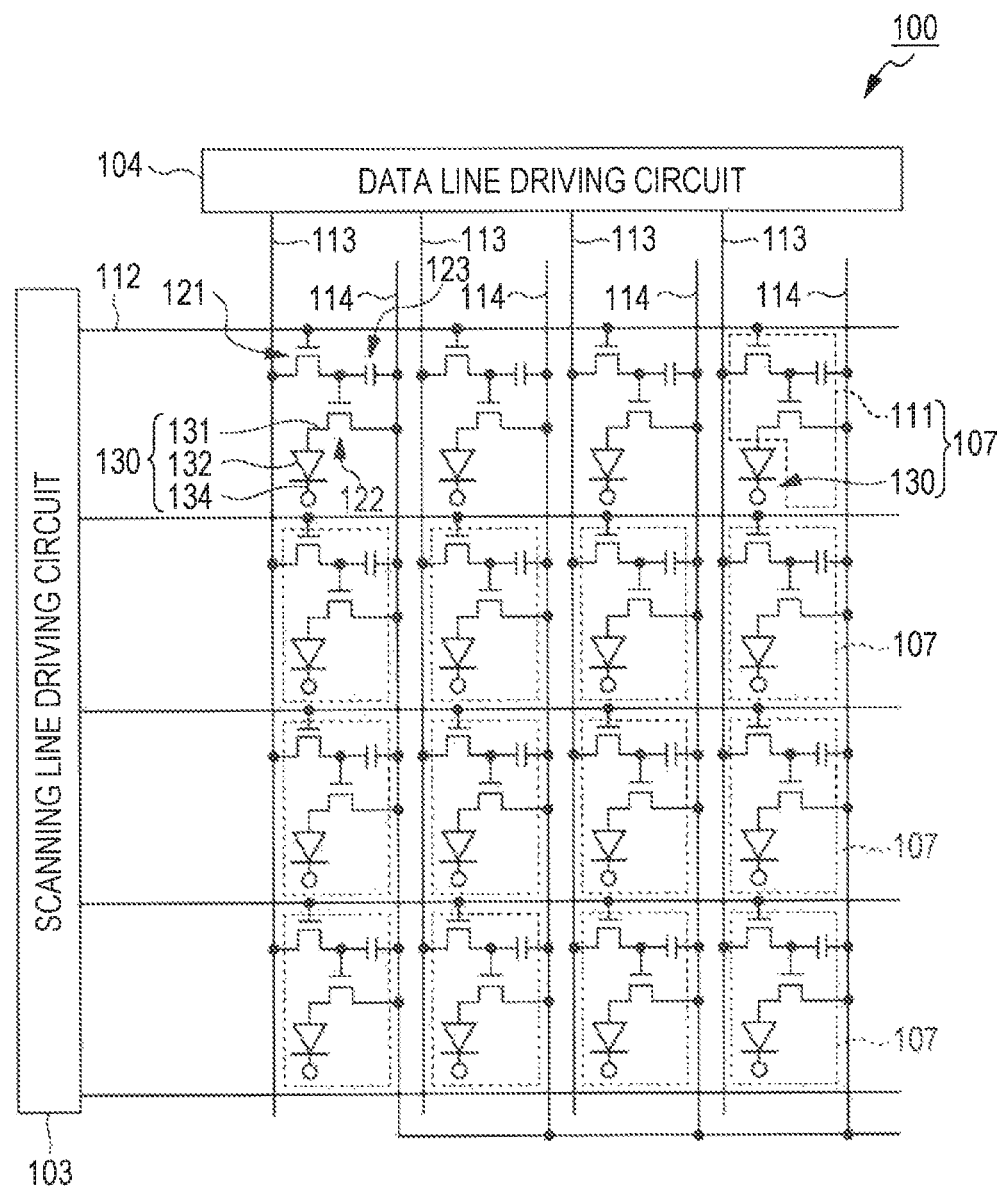
FIG. 1 is an equivalent circuit view showing an electrical configuration of an organic EL apparatus.
Figure 2:
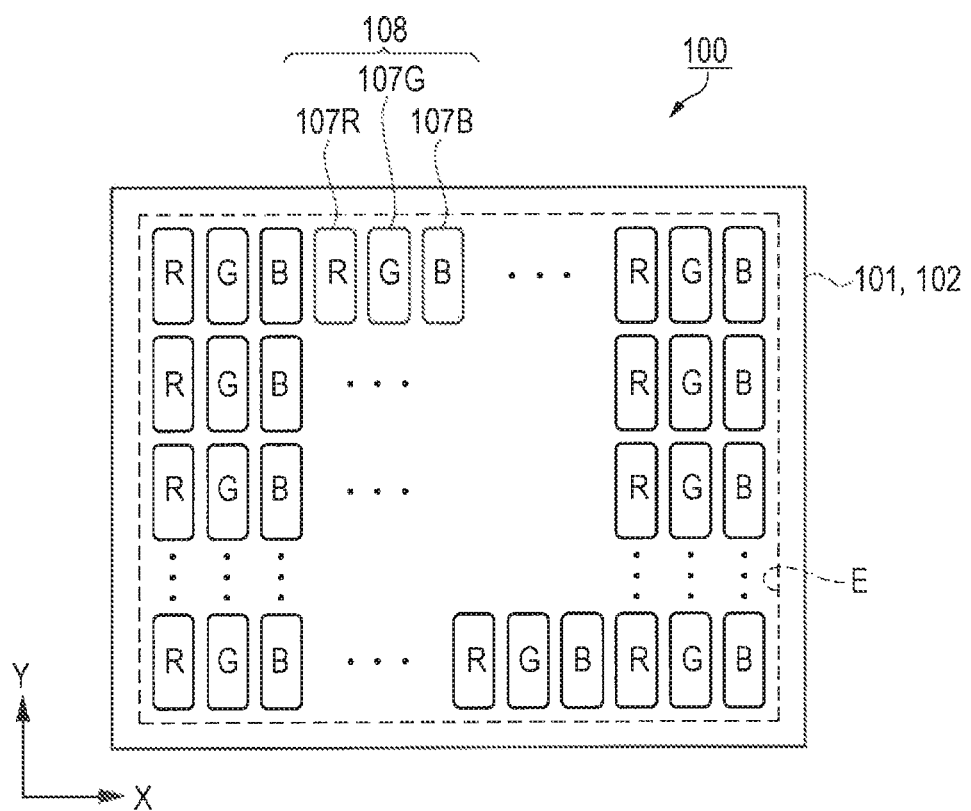
FIG. 2 is a schematic plan view showing a configuration of an organic EL apparatus.
Figure 3:
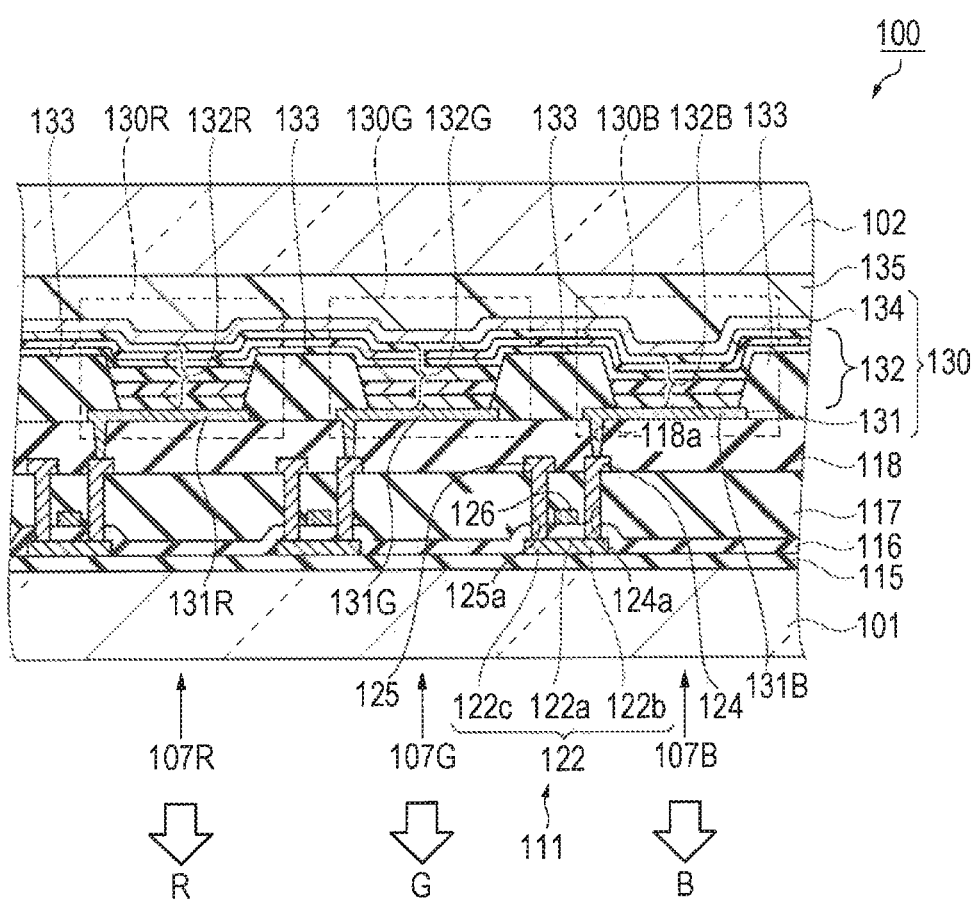
FIG. 3 is a schematic cross-sectional view showing a structure of a pixel of an organic EL apparatus.
Figure 4:
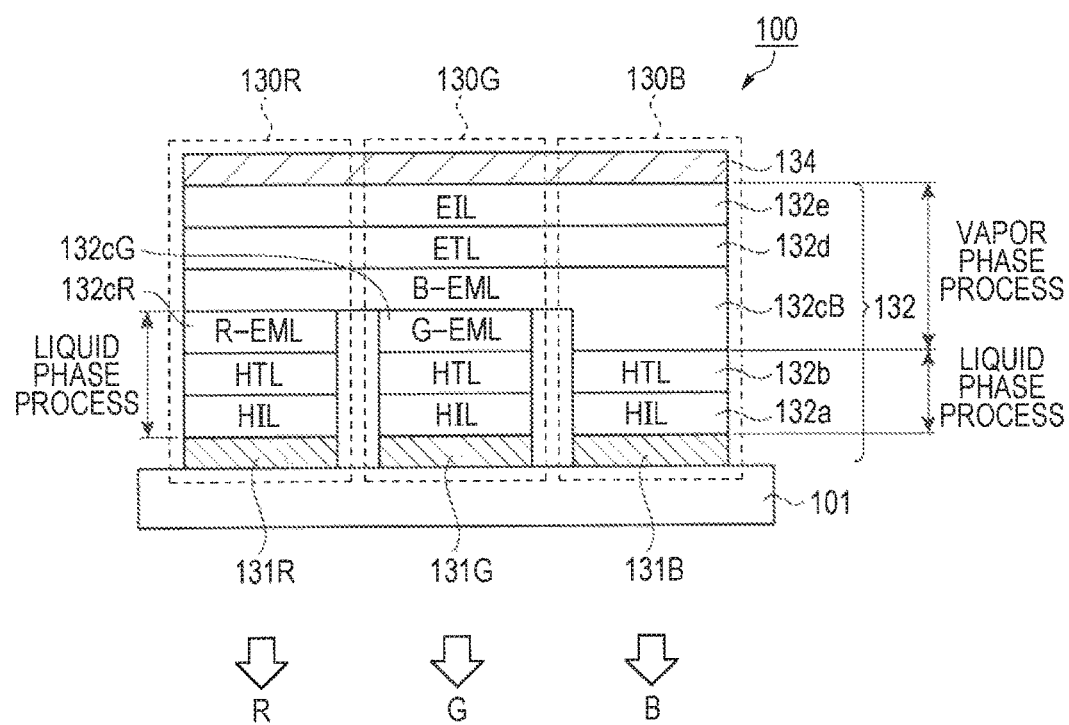
FIG. 4 is a typical view showing a configuration of an organic EL element in a pixel of an organic EL apparatus.

First, description will be given of an example of an organic electro-luminescence (EL) apparatus which is a self-luminous type display apparatus provided with an organic EL element in a pixel with reference to FIG. 1 to FIG. 4. FIG. 1 is an equivalent circuit view showing an electrical configuration of an organic EL apparatus, FIG. 2 is a schematic plan view showing a configuration of an organic EL apparatus, FIG. 3 is a schematic cross-sectional view showing a structure of a pixel of an organic EL apparatus, and FIG. 4 is a typical view showing a configuration of an organic EL element in a pixel of an organic EL apparatus.

As shown in FIG. 1, an organic EL apparatus 100 has a plurality of scanning lines 112 and a plurality of data lines 113 which are crossed each other, and power lines 114 in parallel with respect to each of a plurality of data lines 113. The organic EL apparatus 100 has a scanning line driving circuit 103 connected to a plurality of scanning lines 112 and a data line driving circuit 104 connected to a plurality of data lines 113. In addition, the organic EL apparatus 100 has a plurality of pixels 107 arranged in a matrix state corresponding to each crossing part of a plurality of scanning lines 112 and a plurality of data lines 113.

The pixel 107 has an organic EL element 130 which is a luminescence element and a pixel circuit 111 controlling driving of the organic EL element 130.

The organic EL element 130 is provided with a pixel electrode 131 as an anode, a counter electrode 134 as a cathode, and a functional layer 132 provided between the pixel electrode 131 and the counter electrode 134 and having a luminescence function. Such an organic EL element 130 can be represented as a diode, electrically. Description will be given of a detailed configuration of the functional layer 132 later, however, the functional layer 132 is configured of a plurality of thin film layers including the luminescence layer. Moreover, the counter electrode 134 is formed as a common electrode over a plurality of pixels 107.

The pixel circuit 111 includes a transistor for switch 121, a transistor for driving 122, and a storage capacitor 123. Two transistors 121 and 122 can be configured, for example, using an n-channel type or p-channel type thin film transistor (TFT), or a MOS transistor.

A gate of the transistor for switch 121 is connected to the scanning line 112, one of a source or a drain of the transistor for switch 121 is connected to the data line 113, and the other of a source or a drain of the transistor for switch 121 is connected to a gate of the transistor for driving 122.

One of a source or a drain of the transistor for driving 122 is connected to the pixel electrode 131 of the organic EL element 130 and the other of a source or a drain of the transistor for driving 122 is connected to the power line 114. The storage capacitor 123 is connected between the gate of the transistor for driving 122 and the power line 114.

When the scanning line 112 is driven and the transistor for switch 121 turns to an ON state, a potential based on an image signal supplied from the data line 113 at this time is retained in the storage capacitor 123 through the transistor for switch 121. An ON and OFF state of the transistor for driving 122 is determined in accordance with a potential of the storage capacitor 123, that is, a gate potential of the transistor for driving 122. Then, when the transistor for driving 122 turns to an ON state, a current having a magnitude in accordance with the gate potential flows from the power line 114 to the functional layer 132 sandwiched between the pixel electrode 131 and the counter electrode 134 through the transistor for driving 122. The organic EL element 130 produces luminescence in accordance with the magnitude of the current flowing through the functional layer 132.

Moreover, the configuration of the pixel circuit 111 is not limited thereto. For example, a transistor for controlling luminescence of controlling the conduction between the transistor for driving 122 and the pixel electrode 131 may be provided between the transistor for driving 122 and the pixel electrode 131.

As shown in FIG. 2, the organic EL apparatus 100 has pixels 107R, 107G, and 107B in which the luminescence (the luminescence color) of red color (R), green color (G), and blue color (B) is obtained. Each of the pixels 107R, 107G, and 107B is in a substantially rectangular shape and is arranged in a matrix state in a display region E. The pixels 107R, 107G, and 107B are respectively provided with the organic EL element 130 (refer to FIG. 3) in which the luminescence of the corresponding colors is obtained. The pixels 107 in which the same luminescence colors are obtained are arrayed in a vertical direction (in a column direction or in a longitudinal direction of the pixel 107) on the drawing, and the pixels 107 of different luminescence colors are arrayed in the order of R, G, and B in a horizontal direction (in a row direction or in a short direction of the pixel 107) on the drawing. That is, the pixels 107R, 107G, and 107B of different luminescence colors are arranged in a so-called stripe system.

Hereinafter, the pixels 107R, 107G, and 107B of different luminescence colors are also sometimes collectively referred to as the pixel 107. In addition, a direction in which the pixels 107 of different luminescence colors are arrayed and a direction in which the pixels 107 of the same colors are arrayed are respectively set to an X direction and a Y direction to be explained.

If such an organic EL apparatus 100 is used as a display apparatus, three pixels 107R, 107G, and 107B in which different luminescence colors are obtained are set to one display pixel unit 108 and the respective pixels 107R, 107G, and 107B are electrically controlled. Thereby, a full color display becomes possible.

Moreover, the planar shape and the arrangement of the pixels 107R, 107G, and 107B of different luminescence colors are not limited thereto and, for example, may be the arrangement of a delta system or a mosaic system. In addition, the pixels 107 in which, for example, the luminescence of yellow color (Y) is obtained other than red color (R), green color (G), and blue color (B) may be included without limiting to being provided with the pixels 107 corresponding to three colors of red color (R), green color (G), and blue color (B).

As shown in FIG. 3, the organic EL apparatus 100 has an organic EL element 130R in which the luminescence of red color is obtained, an organic EL element 130G in which the luminescence of green color is obtained, and an organic EL element 130B in which the luminescence of blue color is obtained, which are provided on an element substrate 101. That is, the organic EL element 130R is provided on the pixel 107R, the organic EL element 130G is provided on the pixel 107G, and the organic EL element 130B is provided on the pixel 107B. The respective organic EL elements 130R, 130G, and 130B has the pixel electrode 131 as an anode and the functional layer 132 including the luminescence layer formed on the pixel electrode 131. In addition, the respective organic EL elements 130R, 130G, and 130B have the counter electrode 134 as a common electrode formed to be opposed to the pixel electrode 131 through the functional layer 132.

The pixel electrode 131 is sometimes referred to as the pixel electrodes 131R, 131G, and 131B corresponding to the luminescence colors. In the same way, the functional layer 132 is sometimes referred to as the functional layers 132R, 132G, and 132B corresponding to the luminescence colors. The functional layers 132R, 132G, and 132B respectively include a plurality of thin film layers. At least one thin film layer among a plurality of thin film layers is formed using the ink for forming a functional layer described below by the liquid droplet discharging method (the ink jet method). Description will be given of a detailed configuration and method of forming of the functional layer 132 later.

The pixel electrodes 131R, 131G, and 131B are respectively divided by a barrier wall 133 provided so as to cover a part of the periphery thereof. The barrier wall 133 is formed by using a photosensitive resin material having insulation properties such as, for example, a polyfunctional acrylic-based resin.

The pixel electrode 131 is connected to one of three terminals of the transistor for driving 122 formed on the element substrate 101. A fixed potential, such as, for example, GND is given to the counter electrode 134. By applying a driving potential between the pixel electrode 131 and the counter electrode 134, holes are injected from the pixel electrode 131 into the functional layer 132 and electrons are injected from the counter electrode 134 into the functional layer 132. In the luminescence layer included in the functional layer 132, excitons are formed by the holes and the electrons injected, and when the excitons are disappeared (when the electrons and the holes are recombined), a part of the energy is released as fluorescence and phosphorescence.

The organic EL apparatus 100 of the embodiment has a bottom emission type structure, and a light in which the luminescence is produced from the functional layers 132R, 132G, and 132B is reflected by the counter electrode 134 to be taken out from the element substrate 101 side. Therefore, a transparent substrate such as a glass is used as an element substrate 101. In addition, for a sealing substrate 102 arranged opposite to the element substrate 101 through a sealing layer 135, either a transparent substrate or an opaque substrate can be used. As an opaque substrate, for example, a thermosetting resin, a thermoplastic resin, and the like are included, in addition to one in which ceramics such as alumina or a metal sheet such as stainless steel is subjected to an insulation treatment such as surface oxidation.

In the element substrate 101, the pixel circuit 111 for driving the organic EL element 130 is provided. That is, a semiconductor layer 122a of the transistor for driving 122 is formed on a base insulating film 115 covering one surface of the element substrate 101. The semiconductor layer 122a consists of, for example, polysilicon. A gate insulating film 116 is formed so as to cover the semiconductor layer 122a.

In addition, in the semiconductor layer 122a, a region sandwiching the gate insulating film 116 and overlapping the gate electrode 126 is set to a channel region. Moreover, the gate electrode 126 is electrically connected to the scanning line 112 (not shown). A first interlayer insulating film 117 is formed so as to cover the semiconductor layer 122a and the gate electrode 126.

In addition, in the semiconductor layer 122a, while a low concentration source region and a high concentration source region 122c are provided on the source side of the channel region, a low concentration drain region and a high concentration drain region 122b are provided on the drain side of the channel region, that is, an LDD (Light Doped Drain) structure is formed. Among those, the high concentration source region 122c is connected to a source electrode 125 through a contact hole 125a which is opened over the gate insulating film 116 and the first interlayer insulating film 117. The source electrode 125 is configured as a part of the power line 114 (not shown). On the other hand, the high concentration drain region 122b is connected to a drain electrode 124 provided on the same wiring layer as that of the source electrode 125 through a contact hole 124a which is opened over the gate insulating film 116 and the first interlayer insulating film 117.

A second interlayer insulating film 118 is formed on an upper layer of the first interlayer insulating film 117 on which the source electrode 125 and the drain electrode 124 are formed. The second interlayer insulating film 118 is formed in order to eliminate the unevenness on the surface due to the transistor for driving 122 or the like configuring the pixel circuit 111, the source electrode 125, the drain electrode 124, or the like, and is subjected to a flattening treatment such as CMP (Chemical Mechanical Polishing).

Then, the pixel electrode 131 is formed on the surface of the second interlayer insulating film 118 and is connected to the drain electrode 124 through a contact hole 118a provided on the second interlayer insulating film 118. That is, the pixel electrode 131 is connected to the high concentration drain region 122b of the semiconductor layer 122a through the drain electrode 124. The counter electrode 134 is connected to GND. Therefore, the driving current which is supplied from the power line 114 described above to the pixel electrode 131 by the transistor for driving 122 and flows between the pixel electrode 131 and the counter electrode 134 is controlled. Thereby, the pixel circuit 111 makes the desired organic EL elements 130R, 130G, and 130B produce luminescence and a color display becomes possible.

The element substrate 101 having such an organic EL element 130 is fully sealed with the sealing substrate 102 without any space through the sealing layer 135 using a thermosetting type epoxy resin or the like as a sealing member.

The organic EL element 130 of the organic EL apparatus 100 of the embodiment is manufactured by using a method of manufacturing described below and in forming the functional layers 132R, 132G, and 132B in which different luminescence colors are obtained, the particles (the foreign substances) to be mixed is respectively reduced, and thus the desired luminescent brightness and luminescent lifetimes are obtained.

Moreover, the organic EL apparatus 100 of the embodiment is not limited to bottom emission type and, for example, may be set to a top emission type structure in which the pixel electrode 131 is formed using a conductive material having light reflectivity, the counter electrode 134 as a cathode is formed using a transparent conductive material, and the luminescence from the organic EL element 130 is reflected by the pixel electrode 131 to be taken out from the sealing substrate 102 side. In addition, in a case of having top emission type, the organic EL apparatus 100 may also have a configuration in which color filters corresponding to the luminescence colors of the organic EL element 130 are provided corresponding to each of the organic EL elements 130R, 130G, and 130B. Furthermore, in a case where the organic EL apparatus 100 has a color filter, the organic EL apparatus 100 may also be set to a configuration in which white luminescence is obtained from the organic EL element 130.

Next, description will be given of a specific configuration of the organic EL elements 130R, 130G, and 130B with reference to FIG. 4.

As shown in FIG. 4, the organic EL apparatus 100 has the organic EL element 130R in which the luminescence of red color is obtained, the organic EL element 130G in which the luminescence of green color is obtained, and the organic EL element 130B in which the luminescence of blue color is obtained, which are provided on the element substrate 101.

The organic EL element 130R in which the luminescence of red color is obtained has the pixel electrode 131R as an anode, the counter electrode 134 arranged opposite to the pixel electrode 131R as a cathode, a hole injection layer 132a, a hole transport layer 132b, a luminescence layer 132cR of red (R), a luminescence layer 132cB of blue (B), an electron transport layer 132d, and an electron injection layer 132e laminated from the pixel electrode 131R side in order between the pixel electrode 131R and the counter electrode 134.

The organic EL element 130G in which the luminescence of green color is obtained has the pixel electrode 131G as an anode, the counter electrode 134 arranged opposite to the pixel electrode 131G as a cathode, the hole injection layer 132a, the hole transport layer 132b, a luminescence layer 132cG of green (G), the luminescence layer 132cB of blue (B), the electron transport layer 132d, and the electron injection layer 132e laminated from the pixel electrode 131G side in order between the pixel electrode 131G and the counter electrode 134.

The organic EL element 130B in which the luminescence of blue color is obtained has the pixel electrode 131B as an anode, the counter electrode 134 arranged opposite to the pixel electrode 131B as a cathode, the hole injection layer 132a, the hole transport layer 132b, the luminescence layer 132cB of blue (B), the electron transport layer 132d, and the electron injection layer 132e laminated from the pixel electrode 131B side in order between the pixel electrode 131B and the counter electrode 134.

The pixel electrodes 131R, 131G, and 131B are respectively formed using a transparent electrode material having a big work function such as, for example, ITO (Indium Tin Oxide) by the vapor phase process.

The counter electrode 134 is formed using an electrode material having a small work function such as, for example, Al as a cathode in common to the organic EL elements 130R, 130G, and 130B by the vapor phase process.

Though an illustration is omitted in FIG. 4, the pixel electrodes 131R, 131G, and 131B are respectively divided by the barrier wall 133 which is subjected to a surface treatment. The hole injection layer 132a and the hole transport layer 132b are separately applied, serially, in order to be formed by the liquid phase process in the film forming region divided by the barrier wall 133 corresponding to each of the pixel electrodes 131R, 131G, and 131B. In addition, the luminescence layer 132cR is separately applied to be formed by the liquid phase process on the hole transport layer 132b corresponding to the pixel electrode 131R and the luminescence layer 132cG is separately applied to be formed by the liquid phase process on the hole transport layer 132b corresponding to the pixel electrode 131G.

On the other hand, the luminescence layer 132cB of blue (B), the electron transport layer 132d, and the electron injection layer 132e are commonly formed over three organic EL elements 130R, 130G, and 130B by using the vapor phase process. The vapor phase process in the embodiment, for example, is a vacuum deposition method. In addition, the liquid phase process, for example, is a liquid droplet discharging method (an ink jet method).

The luminescence layer 132cB of blue (B) commonly formed over three organic EL elements 130R, 130G, and 130B by using the vapor phase process is configured by including a host material having electron transport properties. Therefore, even if the luminescence layer 132cB of blue (B) is laminated on the luminescence layer 132cR of red (R), the luminescence of red color is obtained in the organic EL element 130R. In addition, even if the luminescence layer 132cB of blue (B) is laminated on luminescence layer 132cG of green (G), the luminescence of green color is obtained in the organic EL element 130G. The luminescence of blue color is naturally obtained from the organic EL element 130B having the luminescence layer 132cB of blue (B).

Moreover, other thin film layers may be formed for controlling the movement of carriers (the holes and the electrons) between the pixel electrodes 131R and 131G and the luminescence layers 132cR and 132cG, or between the luminescence layer 132cB and the counter electrode 134. In addition, one of the electron transport layer 132d and the electron injection layer 132e can also be removed, depending on a configuration of the counter electrode 134 or the luminescence layer 132cB as a cathode.

Hereinafter, more specifically, description will be give of a configuration of the organic EL elements 130R, 130G, and 130B.

Anode

The pixel electrodes 131R, 131G, and 131B as an anode are electrodes for injecting the holes into the hole injection layer 132a.

A constituent material of these pixel electrodes 131R, 131G, and 131B is not particularly limited, however, a material having a big work function and excellent conductivity is suitably used, and, for example, a metallic oxide such as ITO (Indium Tin Oxide), IZO (Indium Zinc Oxide), $In_2O_3$, $SnO_2$, fluorine-added $SnO_2$, Sb-added $SnO_2$, ZnO, Al-added ZnO, or Ga-added ZnO, Au, Pt, Ag, and Cu or an alloy including these, and the like are included and these can be used as one kind or in combination of two or more kinds thereof.

The film thickness of such pixel electrodes 131R, 131G, and 131B is not particularly limited, however, is preferably in a range from 10 nm to 200 nm and is more preferably in a range from 30 nm to 150 nm.

Hole Injection Layer

The hole injection layer 132a is formed by applying a solution including a hole injection material (an ink for forming a functional layer) onto the predetermined film forming region, and then drying and heating the region (the liquid phase process). As a hole injection material, for example, a mixture (PEDOT:PSS) in which polystyrene sulfonate (PSS) as a dopant is added to a polythiophene derivative such as polyethylenedioxythiophene (PEDOT), polystyrene, polypyrrole, poly vinyl carbazole (PVK), polyaniline, oligoaniline, and polyacetylene or a derivative thereof, and the like are included.

The film thickness of the hole injection layer 132a is not particularly limited, however, is preferably in a range from 10 nm to 150 nm.

Hole Transport Layer

The hole transport layer 132b is provided between the hole injection layer 132a and the luminescence layers 132cR, 132cG, and 132cB in the organic EL elements 130R, 130G, and 130B, in order to improve transport properties (injection properties) of the holes to the luminescence layers 132cR, 132cG, and 132cB and suppress a decrease in function of the hole injection layer 132a due to the entering of electrons from the luminescence layers 132cR, 132cG, and 132cB into the hole injection layer 132a. That is, the hole transport layer 132b is for improving the luminescent efficiency owing to the combination of the holes and the electrons in the luminescence layers 132cR, 132cG, and 132cB.

The hole transport layer 132b comes into contact with the hole injection layer 132a of the organic EL elements 130R, 130G, and 130B to be formed in common with the organic EL elements 130R, 130G, and 130B, by applying a solution including a hole transport material (an ink for forming a functional layer) onto the predetermined film forming region, and then drying and heating the region (the liquid phase process).

As a hole transport material, for example, a polymer of an amine-based compound such as triphenyldiamine (TPD) is suitably used. In addition, a high molecular organic material such as a polyfluorene derivative (PF), a polyparaphenylene vinylene derivative (PPV), a polyparaphenylene derivative (PPP), poly vinyl carbazole (PVK), a polythiophene derivative, or polysilane-based including poly methyl phenyl silane (PMPS) is included.

The film thickness of the hole transport layer 132b is not particularly limited, however, is preferably in a range from 15 nm to 25 nm.

Luminescence Layers 132cR and 132cG

The luminescence layer 132cR in which the luminescence of red color is obtained and the luminescence layer 132cG in which the luminescence of green color is obtained come into contact with the hole transport layer 132b of the organic EL elements 130R and 130G to be selectively formed corresponding to the organic EL elements 130R and 130G, respectively by applying a solution including a luminescence layer forming material in which the luminescence material as a guest material is doped in the host material(an ink for forming a functional layer) onto the predetermined film forming region, and then drying and heating the region (the liquid phase process).

As a host material, a low molecular material such as TDAPB (1,3,5-tris-(N,N-bis-(4-methoxy-phenyl)-amino phenyl)-benzene), CBP (4,4'-bis(9-dicarbazolyl)-2,2'-biphenyl), BAlq (bis-(2-methyl-8-quinolinolate)-4-(phenylphenolate)aluminum), mCP (N,N-dicarbazolyl-3,5-benzene: a CBP derivative), CDBP (4,4'-bis(9-carbazolyl)-2,2'-dimethyl-biphenyl), DCB (N,N'-dicarbazolyl-1,4-dimethene-benzene), P06 (2,7-bis(diphenylphosphineoxide)-9,9-dimethylfluorene), SimCP (3,5-bis(9-carbazolyl) tetraphenylsilane), or UGH3 (w-bis(triphenylsilyl)benzene) is included. Any of these low molecular host materials have electron transport properties.

As a luminescence material, either a fluorescence material and a phosphorescence material can be used. As a fluorescence material, ADS111RE (red color) and ADS108GE (green color) (poly[{9,9-dioctyl-2,7-divinylene-fluorenylene}-alt-co-{2-methoxy-5-(2-ethylhexyloxy)-1,4-phenylene}]) manufactured by American Dye Source, Inc. are included.

As a phosphorescence material, an iridium complex such as Bt2Ir(acac) (bis(2-phenylbenxothiozolato-N,C2')iridium (III) (acetylacetonate)) or Btp2Ir(acac) (bis(2,2'-benzothienyl)-pyridinato-N,C3)iridium(acetylacetonate)) and a platinum complex such as PtOEP (2,3,7,8,12,13,17,18-octaethyl-21H,23H-porphine, platinum (II)) are included, and it is possible to obtain the phosphorescence of red color by adding these to the host material described above.

In addition, an iridium complex such as Ir(ppy)3 (fac-tris (2-phenypyridine)iridium) or Ppy2Ir(acac) (bis(2-phenyl-pyridinato-N,C2)iridium(acetylacetone)) is included, and it is possible to obtain the phosphorescence of green color by adding these to the host material described above.

The film thickness of the luminescence layers 132cR and 132cG is not particularly limited, however, is preferably in a range from 5 nm to 100 nm and is more preferably in a range from 10 nm to 50 nm.

Luminescence Layer 132cB

The luminescence layer 132cB in which the luminescence of blue color is obtained is formed in common with the organic EL elements 130R, 130G, and 130B by doping the guest material (the luminescence material) in the low molecular host material having electron transport properties described above by the vapor phase process.

As a host material of the luminescence layer 132cB, it is preferable to use an anthracene derivative. In addition, as a guest material (the luminescence material) of the luminescence layer 132cB, either a fluorescence material or a phosphorescence material can be used. As a fluorescence material, ADS136BE (blue color) manufactured by American Dye Source, Inc. is included.

As a phosphorescence material, an iridium complex such as Flrpic (iridium-bis(4,6-difluorophenyl-pyridinato-N,C2)-picolinate), Ir(pmb)3 (iridium-tris(1-phenyl-3-methyl benz-imidazolin-2-ylidene-C,C(2)')), FIrN4 (iridium(III)-bis(4,6-difluorophenylpyridinato) (5-(pyridin-2-yl)-tetrazolate)), or Flrtaz (iridium(III)bis(4,6-difluorophenylpyridinato) (5-(pyridine-2-yl)-1,2,4-triazolate)) is included, and it is possible to obtain the phosphorescence of blue color by adding these to the host material described above.

Electron Transport Layer

The electron transport layer 132d is formed by using the vapour phase process and has a function of transporting the electrons injected from the counter electrode 134 as a cathode into the electron transport layer 132d to the luminescence layer 132cB. In addition, the electron transport layer 132d also has a function of blocking the holes passing through from the luminescence layer 132cB to the electron transport layer 132d in some cases.

A electron transport material configuring the electron transport layer 132d is not particularly limited, however, for example, BALq, OXD-1 (1,3,5-tri-(5-(4-tert-butylphenyl)-1,3,4-oxadiazole)), BCP (bathocuproine), PBD (2-(4-biphenyl)-5-(4-tert-butylphenyl)-1,2,4-oxadiazole), TAZ (3-(4-biphenyl)-5-(4-tert-butylphenyl)-1,2,4-triazole), DPVBi (4,4'-bis(1,1-bis-diphenylethenyl)biphenyl), BND (2,5-bis(1-naphthyl)-1,3,4-oxadiazole), DTVBi (4,4'-bis(1,1-bis(4-methylphenyl)ethenyl)biphenyl), BBD (2,5-bis(4-biphenylyl)-1,3,4-oxadiazole), and the like are included so as to be able to form the electron transport layer 132d by using the vapour phase process such as a deposition method.

In addition, tris(8-quinolinolato)aluminium (Alq3), an oxadiazole derivative, an oxazole derivative, a phenanthroline derivative, an anthraquinodimethane derivative, a benzoquinone derivative, a naphthoquinone derivative, an anthraquinone derivative, a tetracyanoanthraquinodimethane derivative, a fluorene derivative, a diphenyldicyanoethylene derivative, a diphenoquinone derivative, a hydroxyquinoline derivative, and the like are included. These can be used as one kind or in combination of two or more thereof.

The film thickness of the electron transport layer 132d is not particularly limited, however, is preferably in a range from 1 nm to 100 nm and is more preferably in a range from 5 nm to 50 nm.

Electron Injection Layer

The electron injection layer 132e is formed by using the vapor phase process and has a function of improving injection efficiency of the electrons from the counter electrode 134 into the electron transport layer 132d.

A constituent material of the electron injection layer 132e (an electron injection material) is not particularly limited, however, for example, an alkali metal, an alkaline earth metal, or a compound of an alkali metal or an alkaline earth metal is included, and these can be used as one kind or in combination of two or more kinds thereof.

As an alkali metal, for example, Li, Na, K, Rb, and Cs are included. In addition, as an alkaline earth metal, for example, Mg, Ca, Sr, and Ba are included.

As a compound of an alkali metal, for example, an alkali metal salt such as LiF, $Li_2CO_3$, LiCl, NaF, $Na_2CO_3$, NaCl, CsF, $Cs_2CO_3$, or CsCl is included. In addition, as a compound of an alkaline earth metal, for example, an alkaline earth metal salt such as $CaF_2$, $CaCO_3$, $SrF_2$, $SrCO_3$, $BaF_2$, or $BaCO_3$ is included.

The film thickness of the electron injection layer 132e is not particularly limited, however, is preferably in a range from 0.01 nm to 10 nm and more preferably in a range from 0.1 nm to 5 nm.

Cathode

The counter electrode 134 as a cathode is an electrode for injecting the electrons into the electron injection layer 132e.

It is preferable to use a material having a small work function as a constituent material of the counter electrode 134. In addition, for example, Li, Mg, Ca, Sr, La, Ce, Er, Eu, Sc, Y, Yb, Ag, Cu, Al, Cs, Rb, and Au or an alloy including these, or the like is used so as to be able to form the counter electrode 134 by using the vapour phase process such as a deposition method and these can be used as one kind or in a combination of two or more kinds thereof (for example, a laminated body having a plurality of layers or the like).

In particular, in a case of setting to the organic EL apparatus 100 having the bottom emission structure as the embodiment, light transmitability is not required for the counter electrode 134 and as a constituent material of the counter electrode 134, for example, a metal such as Al, Ag, AlAg, or AlNd or an alloy thereof is preferably used. By using such a metal or alloy as a constituent material of the counter electrode 134, an improvement of the electron injection efficiency and stability of the counter electrode 134 can be achieved.

The film thickness of the counter electrode 134 in the bottom emission structure is not particularly limited, however, for example, is preferably in a range from 50 nm to 1,000 nm and is more preferably in a range from 100 nm to 500 nm.

In a case where the organic EL apparatus 100 is set to the top emission structure, for example, a metal such as MgAg, MgAl, MgAu, and AlAg or an alloy thereof is preferably used, as a constituent material of the counter electrode 134. By using such a metal or alloy as a constituent material of the counter electrode 134, while light transmitability of the counter electrode 134 is maintained, an improvement of the electron injection efficiency and stability of the counter electrode 134 can be achieved.

The film thickness of the counter electrode 134 in the top emission structure is not particularly limited, however, for example, is preferably in a range from 1 nm to 50 nm and is more preferably in a range from 5 nm to 20 nm.

As a liquid phase process used when forming the hole injection layer 132a, the hole transport layer 132b, and the luminescence layers 132cR and 132cG included in the functional layer 132R, 132G, and 132B, it is preferable to use the liquid droplet discharging method (the ink jet method) of discharging a solution (an ink for forming a functional layer) from a nozzle of an ink jet head as a droplet. It is possible to accurately discharge a solution with the predetermined amount into the desired film forming region as a droplet according to the liquid droplet discharging method (the ink jet method). As a liquid phase process other than the liquid droplet discharging method (the ink jet method), a spin coating method (a pyrosol method), a casting method, a microgravure coating method, a gravure coating method, a bar coating method, a roll coating method, a wire bar coating method, a dip coating method, a spray coating method, a screen printing method, a flexo printing method, an offset printing method, and the like are included.

As a vapor phase process, a deposition method, a sputtering method, an ion beam method, and the like are included. It is preferable to use a deposition method in that heat or the like has hardly any effect on the film formed earlier when the film is formed.

Method of Manufacturing Organic EL Element

Next, description will be given of a method of manufacturing an organic EL element of the embodiment with reference to FIGS. 5A to 5E and FIGS. 6F to 6H. FIGS. 5A to 5E and FIGS. 6F to 6H are schematic cross-sectional views showing a method of manufacturing an organic EL element. The ink for forming a functional layer of the invention is applied to the method of manufacturing an organic EL element of the embodiment. Therefore, description will be given of an organic EL element 130R in which the hole injection layer 132a, the hole transport layer 132b, and the luminescence layer 132cR among the functional layers 132 are formed by the liquid phase process as an example. That is, FIGS. 5A to 5E and FIGS. 6F to 6H show a method of manufacturing the organic EL element 130R. Hereinafter, an ink for forming a functional layer is referred to as simply "an ink" for convenience of explanation.

Figure 5A:
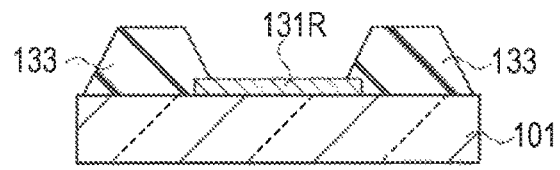
FIGS. 5A to 5E are schematic cross-sectional views showing a method of manufacturing an organic EL element.

Firstly, as shown in FIG. 5A, the barrier wall 133 which covers the periphery (the part of the outer edge) of the pixel electrode 131R and divides a region provided with the pixel electrode 131R is formed (a barrier wall forming process). The region divided by the barrier wall 133 becomes the film forming region onto which an ink including the functional layer forming material is applied.

As a specific method of forming the barrier wall 133, a solution including, for example, a polyfunctional acrylic-based resin is applied and dried by a method such as a spin coating method so as to cover the surface of the element substrate 101 provided with the pixel electrode 131R and a photosensitive resin layer is formed. Afterward, a method of forming the barrier wall 133 by patterning the photosensitive resin layer by a photolithography method is included.

Since the ink is applied onto the film forming region including the pixel electrode 131R in the latter process, the film forming region is subjected to the surface treatment so that the surface of the barrier wall 133 exhibits liquid repellency with respect to the ink and the surface of the pixel electrode 131R which is an example of an object to be discharged exhibits lyophilicity.

As a method of the surface treatment, firstly, oxygen as a treatment gas is subjected to a plasma treatment, the surface of the pixel electrode 131R and the surface of the barrier wall 133 (including the surface of wall) are activated to be lyophilicity. Subsequently, the plasma treatment is performed using a fluorine-based treatment gas such as $CF_4$. Thereby, a method of selectively making the surface of the barrier wall 133 liquid repellent by reacting a fluorine-based treatment gas only on the surface of the barrier wall 133 consisting of an acrylic-based resin is included.

Moreover, the method of forming the barrier wall 133 in which the surface has liquid repellency is not limited thereto, and, for example, a method in which the barrier wall 133 is formed using a polyfunctional acrylic-based resin including a fluorine-based liquid repellency material may be employed.

Figure 5B:
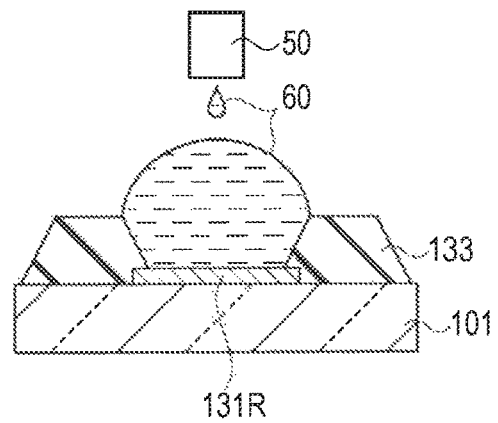
Figure 5C:
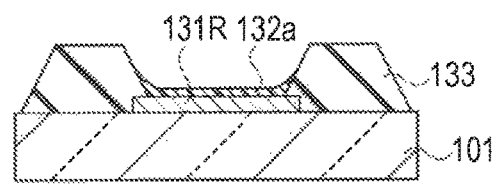

Next, in the hole injection layer forming process, an ink 60 including the hole injection material is applied onto each film forming region divided by the barrier wall 133, as shown in FIG. 5B. For an application of the ink 60, the ink jet method (the liquid droplet discharging method) in which the ink 60 is discharged from a nozzle of the ink jet head 50 as a droplet, while the ink jet head 50 is arranged opposite and relatively moves to the element substrate 101, is used. The applied ink 60 is filled into the film forming region divided by the barrier wall 133 and is raised by the interfacial surface tension. Then, the applied ink 60 is heated and dried, for example, under an air atmosphere and the hole injection layer 132a coming into contact with the pixel electrode 131R is formed, as shown in FIG. 5C. In addition, in the embodiment, the ink 60 with the predetermined amount as a droplet was discharged to the film forming region from the ink jet head 50 so that the film thickness of the hole injection layer 132a is approximately 130 nm after drying.

The ink 60 is one, for example, in which poly vinyl carbazole (PVK) at a concentration of approximately 2.0 wt % which is the hole injection material is dissolved in 3-phenoxytoluene as a solvent.

Figure 5D:
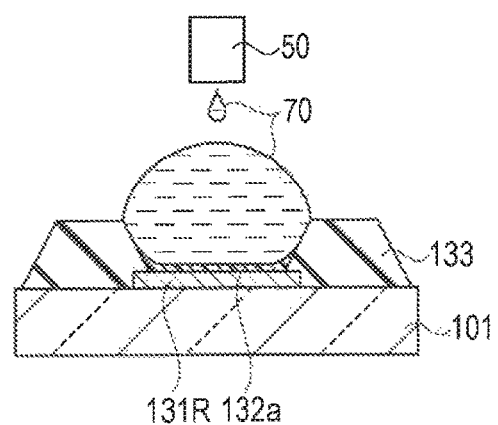
Figure 5E:
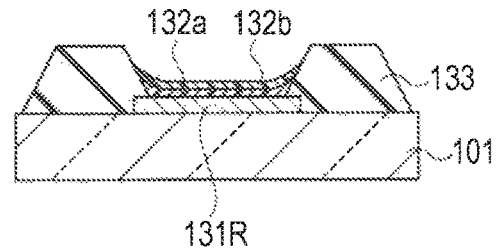

Next, in the hole transport layer forming process, an ink 70 including the hole transport material is applied onto the film forming region divided by the barrier wall 133, as shown in FIG. 5D. The ink jet head 50 is also used for an application of the ink 70. For the ink 70, for example, a 3-phenoxytoluene solution including poly[(9,9-dioctylfluorenyl-2,7-diyl)-co-(4,4'-(N-(4-sec-butylphenyl))diphenylamine)] (TFB) in a concentration range from 1.5 wt % to 2.0 wt % as a hole transport material is used. The applied ink 70 is filled into the film forming region divided by the barrier wall 133 and is raised by the interfacial surface tension. Then, the applied ink 70 is heated and dried, for example, under a nitrogen atmosphere and the hole transport layer 132b coming into contact with the hole injection layer 132a is formed, as shown in FIG. 5E. The ink 70 with the predetermined amount as a droplet was discharged from the ink jet head 50 so that the film thickness of the hole transport layer 132b is approximately 20 nm after drying.

Figure 6F:
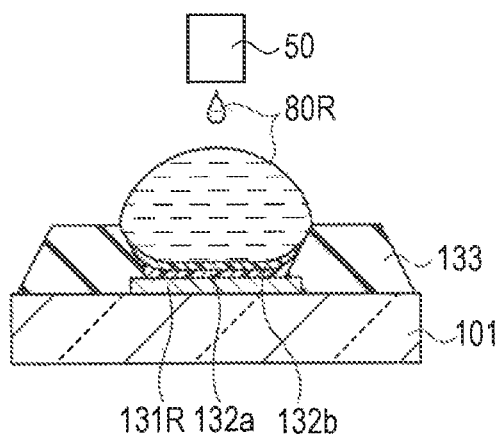
FIGS. 6F to 6H are schematic cross-sectional views showing a method of manufacturing an organic EL element.
Figure 6G:
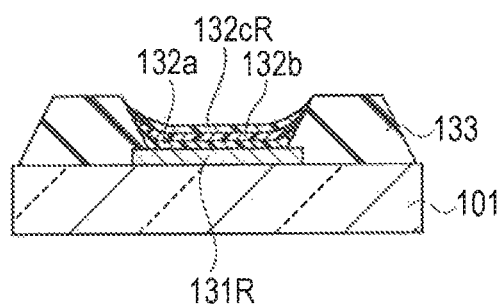

Next, in the luminescence layer forming process, an ink 80R including the luminescence layer forming material is applied onto the film forming region divided by the barrier wall 133, as shown in FIG. 6F. The ink jet head 50 is also used for an application of the ink 80R. For the ink 80R, for example, a 3-phenoxytoluene solution including the luminescence layer forming material at a concentration from 1.0 wt % to 2.0 wt % adding the luminescence material in which the luminescence of red color is obtain to the host material described above is used. The applied ink 80R is filled into the film forming region divided by the barrier wall 133 and is raised by the interfacial surface tension. Then, as to the applied ink 80R, for example, after decompression drying is performed at a vacuum degree of 5 Pa or less for 30 minutes, the applied ink 80R is dried at 130° C. for 10 minutes under a nitrogen atmosphere using a drying machine (a oven) and the luminescence layer 132cR coming into contact with the hole transport layer 132b is formed, as shown in FIG. 6G. The applied ink 80R with the predetermined amount as a droplet was discharged from the ink jet head 50 so that the film thickness of the luminescence layer 132cR is approximately 45 nm after drying.

Figure 6H:
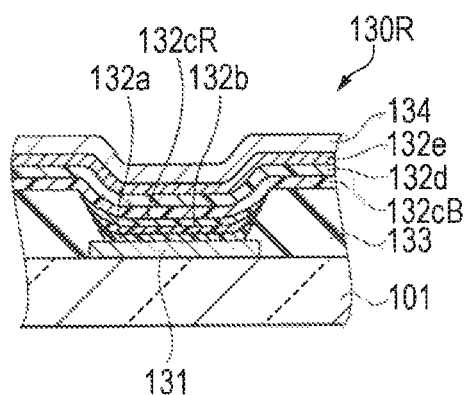

Next, the luminescence layer 132cB, the electron transport layer 132d, the electron injection layer 132e, and the counter electrode 134 as a cathode are formed by the vapor phase process. Specifically, the films are sequentially formed using the materials of each layer described above, for example, by a vacuum deposition method and each layer is formed by laminating so as to cover the film forming region divided by the barrier wall 133 and the exposed surface of the barrier wall 133, as shown in FIG. 6H. In particular, it is preferable to form the counter electrode 134 by a vacuum deposition method in that a damage of the functional layer 132 by heat can be prevented. In addition, in order to prevent a decrease in luminescence function or luminescent lifetime of the functional layer 132 due to water or a gas such as oxygen entering into the functional layer 132 from outside, the film may be formed using an inorganic material such as, for example, an oxide or nitride of silicon or an oxynitride of silicon having gas barrier properties so as to cover the surface of the counter electrode 134. Thereby, the organic EL element 130R having excellent luminescent characteristics (luminescent brightness, luminescent lifetime, or the like) is produced.

Moreover, the method of manufacturing the organic EL element 130R is applied to a method of manufacturing the organic EL element 130G in the organic EL apparatus 100 and in the luminescence layer forming process, an ink 80G including the luminescence layer forming material adding the luminescence material in which the luminescence of green color is obtained and the host material is used. The processes except the luminescence layer forming process are the same as those of the method of manufacturing the organic EL element 130R. In addition, the method of manufacturing the organic EL element 130R is applied to a method of manufacturing the organic EL element 130B in the organic EL apparatus 100, and in the luminescence layer forming process, the processes of forming each thin film layer of the hole injection layer 132a, the hole transport layer 132b, the electron transport layer 132d, the electron injection layer 132e, and the counter electrode 134 are the same as those of the method of manufacturing the organic EL element 130R except forming the luminescence layer 132cB by the vapor phase process.

Ink for Forming Functional Layer and Method of Manufacturing the Same

In the process of manufacturing the organic EL elements 130R, 130G, and 130B described above, the ink for forming a functional layer of the invention is applied to the respective inks 60, 70, 80R, and 80G which are used, and the size and the number of the particles included in the ink for forming a functional layer are controlled. Hereinafter, description will be given of an ink for forming a functional layer of the invention and a method of manufacturing the same with reference to FIG. 7 to FIGS. 11A and 11B.

Figure 7:
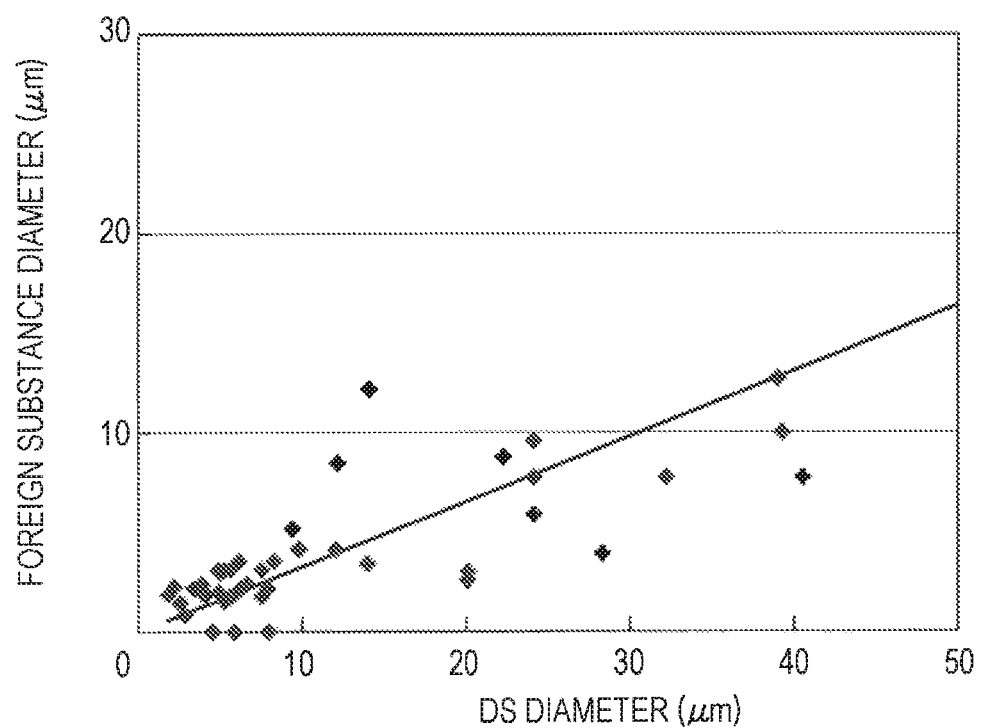
FIG. 7 is a graph showing the relation between the size of a dark spot (DS) and the size of a foreign substance.

FIG. 7 is a graph showing the relation between the size of a dark spot (DS) and the size of a foreign substance, and FIG. 8 is a table showing a proportion of an area which the size of a dark spot (DS) occupies in a pixel area.

Firstly, description will be given of the relation between particles (foreign substances) included in an ink for forming a functional layer and a dark spot (DS) with reference to FIG. 7 to FIG. 8.

For example, the organic EL element 130R has the functional layer 132R between the pixel electrode 131 and the counter electrode 134. The functional layer 132R includes the hole injection layer 132a, the hole transport layer 132b, the luminescence layer 132cR, the luminescence layer 132cB, the electron transport layer 132d, and the electron injection layer 132e. As described above, a range of the film thickness of the functional layer 132R is from 46 nm to 385 nm in view of a range of the film thickness of each thin film layer. Even if the functional layer 132R includes a thin film layer other than the thin film layers described above, the maximum value of the film thickness thereof is possibly approximately 500 nm (0.5 μm) or less, even with consideration of luminescence characteristics such as, for example, a driving voltage or luminescent lifetime. For example, when the bigger particles having conductivity (the particles of a size of 0.5 μm or more having conductivity) than the film thickness of the functional layer 132R are mixed into the functional layer 132R, an electrical short circuit is generated between the pixel electrode 131 and the counter electrode 134, and thus the luminescence is not produced from the organic EL element 130R. That is, the pixel 107R including the organic EL element 130R becomes a defective pixel. In addition, when the organic EL element 130R is electrically short circuited and an excess current starts to flow, it becomes difficult to flow enough current to the organic EL element 130R which is short circuited and another organic EL element 130 expected to produce luminescence at the same time, and thus there is a risk to occur luminescence unevenness. Therefore, the thing to be expected to avoid most is that the particles having conductivity is mixed into the ink for forming a functional layer.

On the other hand, even if the particles included in the ink for forming a functional layer has insulation properties, the current does not flow into the functional layer 132R at a part of which the particles exist, therefore, the part of which the particles exist becomes a dark spot (DS) in which luminescence is not produced.

Therefore, the inventors examined the relation between the size of the dark spot (DS) and the size of particles (foreign substances) which make the dark spot (DS) be generated by turning on a plurality of organic EL apparatuses 100 (samples) which are manufactured by way of trial to be observed. Moreover, "the size" described herein indicates a maximum diameter.

The length of an opposite angle in the display region E of the organic EL apparatus 100 which is manufactured by way of trial is approximately 3 inch and the number of pixels is 15,105. One display pixel unit 108 has three pixels 107 which are R, G, and B. The size of the luminescence region of the organic EL element 130 of one pixel 107 in a trial product (approximately, equivalent to the size of the film forming region) is 27,197 μm².

As a result of truing on a plurality of organic EL elements 130R of the trial products to be confirmed, it was confirmed that there was a correlation between the size of the dark spot (DS) and the size of the particles (the foreign substances), as shown in FIG. 7. Specifically, when the size of the dark spot (DS) is, for example, approximately 10 μm, the size of the particles (the foreign substances) which are the cause thereof was approximately 3 μm at the smallest particles. In addition, when the size of the dark spot (DS) is approximately 25 µm, the size of the particles (the foreign substances) which are the cause thereof was approximately 6 µm at the smallest particles. The size of the particles (the foreign substances) which are the cause of the dark spot (DS) is from 1/3.5 to ⅛ of the size of the dark spot (DS). That is, since the configuration of the thin film layer is not proper not only on the part of which the particles (the foreign substances) exist, but also on the periphery thereof, the region in which the luminescence is not normally produced exists. Moreover, in a graph shown in FIG. 7, an inclination of an approximation primary straight line showing the correlation is approximately 0.33. In addition, the relation between the size of the dark spot (DS) and the size of the particles (the foreign substances) was examined, after removing the dark spot (DS) including the particles (the foreign substances) having a size of 20 µm or more which were mixed clearly from environmental sources during manufacturing the trial products.

On the other hand, whether the pixel 107 having the dark spot (DS) practically becomes a defective pixel or not depends on how much the brightness of the pixel 107 due to the dark spot (DS) decreases with respect to the predetermined value. Even if the dark spot (DS) is included, if the proportion of a decrease in brightness is small, it is difficult to visually confirm, and thus it is not determined as a defective pixel. It is considered that the proportion of a decrease in brightness of the pixel 107 is in proportion to the proportion of an area of the dark spot (DS) occupying in an area of the pixel 107.

As shown in FIG. 8, for example, when the length of an opposite angle in the display region E in the panel specification of the organic EL apparatus 100 is set to 55 inch and the number of pixels is set to 3,840×2,160=8,294,400 (hereinafter, this number of pixels is referred to as 4K2K), one pixel area becomes, for example, 11,729 µm$^2$. In this pixel area, for example, the proportion of an area in which the dark spot (DS) having a size of 4 µmφ (12.6 µm$^2$) occupies becomes 0.11%. In the same way, the proportion of an area in which the dark spot (DS) having a size of 10 µmφ (78.5 µm$^2$) occupies becomes 0.67% and the proportion of an area in which the dark spot (DS) having a size of 20 µmφ (314 µm$^2$) occupies becomes 2.68%.

In addition, for example, when the length of an opposite angle in the display region E in the panel specification is set to 42 inch, one pixel area becomes, for example, 6,840 µm$^2$ even with the same number of pixels of 4K2K. In this pixel area, for example, the proportion of an area in which the dark spot (DS) having a size of 4 µmg) (12.6 µm$^2$) occupies becomes 0.18%. In the same way, the proportion of an area in which the dark spot (DS) having a size of 10 µmφ (78.5 µm$^2$) occupies becomes 1.15% and the proportion of an area in which the dark spot (DS) having a size of 20 µmφ (314 µm$^2$) occupies becomes 4.59%.

In addition, for example, when the length of an opposite angle in the display region E in the panel specification is set to 55 inch and the number of pixels is set to 7,680×4,320=33,177,600 (hereinafter, this number of pixels is referred to as 8K4K), one pixel area becomes, for example, 2,932 µm$^2$. In this pixel area, for example, the proportion of an area in which the dark spot (DS) having a size of 4 µmφ (12.6 µm$^2$) occupies becomes 0.43%. In the same way, the proportion of an area in which the dark spot (DS) having a size of 10 µmφ (78.5 µm$^2$) occupies becomes 2.68% and the proportion of an area in which the dark spot (DS) having a size of 20 µmφ (314 µm$^2$) occupies becomes 10.71%.

As described above, whether determined as a defective pixel or not depends on the area (the size) of the dark spot (DS) occupying in the pixel area described above. When the inventors observed the dark spots (DS) by the pixel areas, it was confirmed that a decrease in brightness in the pixel was recognized when the area (the size) of the dark spot (DS) occupying in the pixel area described above exceeded 1.0%.

Therefore, in a case where the pixel area is 27,197 µm$^2$, the allowable size of the dark spot (DS) is approximately 18.6 µmφ. In doing so, the allowable size of the foreign substances which are the cause of the dark spot (DS) becomes 2.3 µm when fitting ⅛ as describe above. In the same way, in a case where the pixel area is 11,729 µm$^2$, the allowable size of the dark spot (DS) is approximately 12.2 µmφ and the allowable size of the foreign substances becomes 1.5 µm. In a case where the pixel area is 6,840 µm$^2$, the allowable size of the dark spot (DS) is approximately 9.3 µmφ and the allowable size of the foreign substances becomes 1.2 µm. In a case where the pixel area is 2,932 µm$^2$, the allowable size of the dark spot (DS) is approximately 6.1 µmφ and the allowable size of the foreign substances becomes 0.8 µm (refer to FIG. 8).

Since the size of the pixel is arbitrarily set depending on the product design, it is preferable to reduce the particles included in the ink for forming a functional layer which is used as much as possible in a case where at least one layer of the thin film layer among the functional layers 132 of the organic EL element 130 provided on the pixel 107 is formed by the liquid phase process. On the other hand, as a method of removing fine particles from the ink for forming a functional layer, a method of filtering the ink for forming a functional layer using a filter requires time and labor and has an effect on productivity in a manufacturing process.

From the correlation between the size of the dark spot (DS) and the actual size of the particles (the foreign substances) showing in FIG. 7, even in a case where the number of pixels is 8K4K described above, it is necessary to control the number of the particles of 0.8 µm or more in which the size of the dark spot (DS) becomes approximately 6.0 µm or more so that the particles (the foreign substances) in the ink for forming a functional layer do not lead to a defective pixel (a pixel in which a decrease in brightness is recognized). Since the pixel area is a design item, when a margin is taken into consideration, it is preferable to control the number of the particles of 0.5 µm or more in which the size of the dark spot (DS) becomes approximately 4.0 µm or more. In other words, the control of the number of the particles having a size less than 0.5 µm may not be set so strictly.

Therefore, the measurement of the particles included in the ink for forming a functional layer after mixing (before filtering) was attempted. In the measurement of the particles, an in-liquid particle counter (KS-42BF) manufactured by RION Co., Ltd. was used. This in-liquid particle counter employs a light scattering system in which the particle diameter and the number of the particles are determined by irradiating with a light beam intersecting to a transparent passage (a flow cell) in a sensor, generating a pulse from a scattered light quantity produced by the particles passing through an irradiation region, and analyzing a pulse height. The minimum diameter of the particles capable of being detected is 0.2 µm. For the measurement, a sample passes through the passage (the flow cell) at a speed of 10 ml/minute. The measurement was performed two to four times and the average value of measurement was set to a result of measurement.

Since it is considered that considerable amount of particles is included in the ink for forming a functional layer after mixing (before filtering), it is not proper that the measurement of an undiluted solution is performed by using the in-liquid particle counter which is a light scattering system. Therefore, not an undiluted solution but a solution in which an undiluted solution was diluted with a solvent was set to a sample. Specifically, one in which the undiluted solution was diluted by 100 times using acetone at EL grade (electronic material grade) manufactured by Kanto Chemical Co., Inc. as a solvent was set to a sample.

Figure 9B:
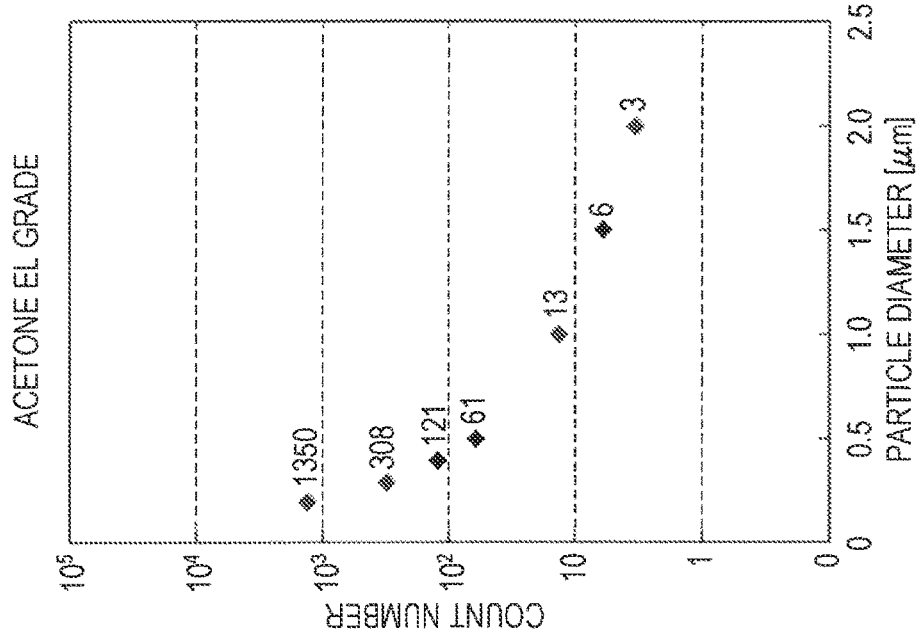
FIG. 9A is a graph showing a result of measurement of particles in an ink for forming a functional layer after dilution and FIG. 9B is a graph showing a result of measurement of particles in acetone which is a solvent used for dilution.
Figure 9A:
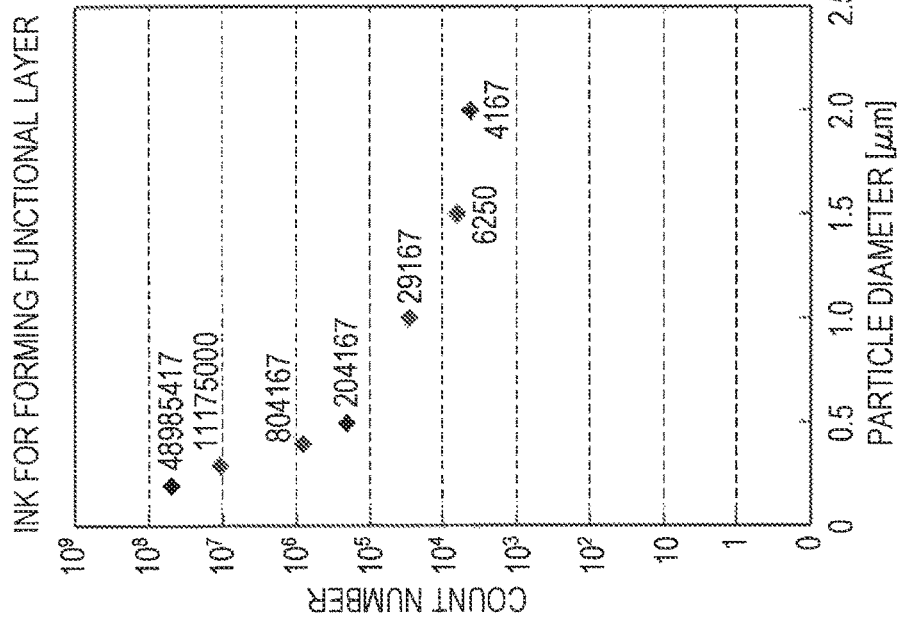

FIG. 9A is a graph showing a result of measurement of particles in an ink for forming a functional layer after dilution and FIG. 9B is a graph showing a result of measurement of particles in acetone which is a solvent used for dilution.

The result of measurement of the particles shown in FIG. 9A is a result in which the number of the particles before dilution is estimated based on a result in which a sample diluted to 100 times with acetone was measured using the in-liquid particle counter after the luminescence layer forming material as a functional layer forming material was dissolved in 3-phenoxytoluene as a solvent so that the concentration of the luminescence layer forming material was 1.0 wt %.

According to the result of measurement (the estimated value) in FIG. 9A, 48,985,417 particles having a particle diameter of 0.2 μm or more, 11,175,000 particles having a particle diameter of 0.3 μm or more, 804,167 particles having a particle diameter of 0.4 μm or more, 204,167 particles having a particle diameter of 0.5 μm or more, 29,167 particles having a particle diameter of 1 μm or more, 6,250 particles having a particle diameter of 1.5 μm or more, and 4,167 particles having a particle diameter of 2.0 μm or more were included in 10 ml of the ink for forming a functional layer.

Moreover, as shown in FIG. 9B, this result of measurement is a result including the particles in acetone used for dilution. Incidentally, 1,350 particles having a particle diameter of 0.2 μm or more, 308 particles having a particle diameter of 0.3 μm or more, 121 particles having a particle diameter of 0.4 μm or more, 61 particles having a particle diameter of 0.5 μm or more, 13 particles having a particle diameter of 1.0 μm or more, 6 particles having a particle diameter of 1.5 μm or more, and 3 particles having a particle diameter of 2.0 μm or more were included in 10 ml of acetone at EL grade. Therefore, the number of the foreign substances included in acetone (EL grade) used for dilution is a level which can be ignored, compared to the number of the particles included in the ink for forming a functional layer after dilution.

Figure 10:
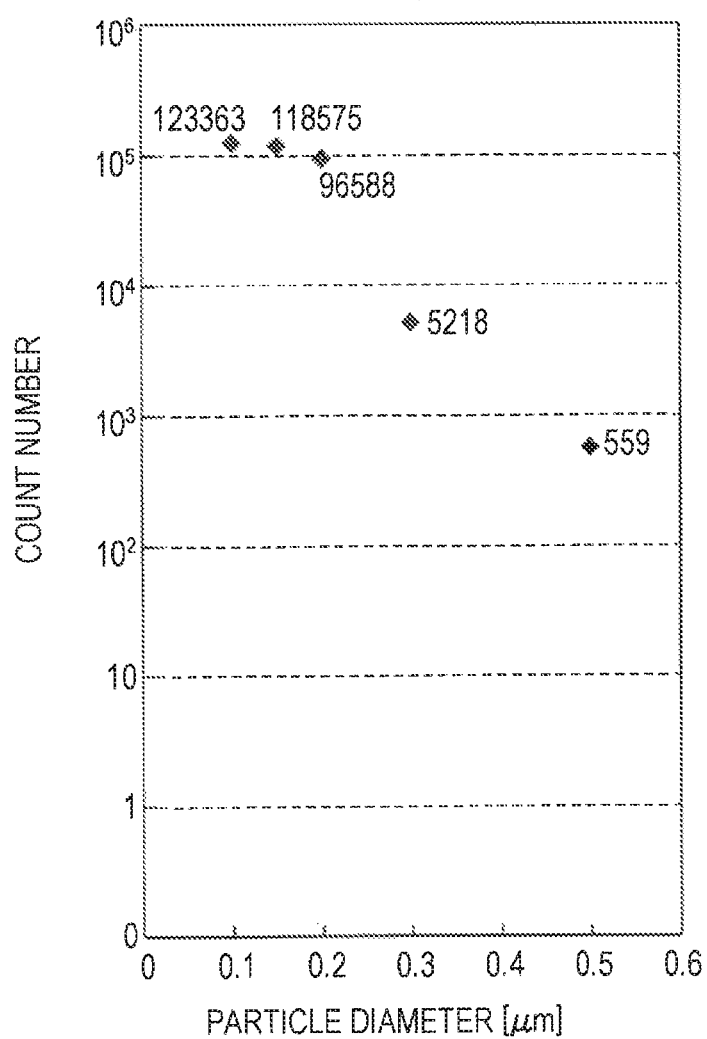
FIG. 10 is a graph showing a result of measurement of particles after an ink for forming a functional layer is filtered using a filter having a hole diameter of 0.2 μm.

Next, description will be given of a result of measurement of the particles after filtering the ink for forming a functional layer (the undiluted solution) using a filter with reference to FIG. 10. FIG. 10 is a graph showing a result of measurement of particles after an ink for forming a functional layer is filtered using a filter having a hole diameter of 0.2 μm. Moreover, in the measurement of the particles in the ink for forming a functional layer after filtering, an in-liquid particle counter KS-42A manufactured by RION Co., Ltd. was used. The minimum diameter in which the in-liquid particle counter KS-42A can detect is 0.1 μm.

Firstly, the filter used for filtration in the embodiment is a capsule type filter provided with a mesh filter having a predetermined hole diameter. As a material of a mesh filter, for example, PFA (tetrafluoroethylene and perfluoroalkyl vinyl ether copolymer) or PTFE (polytetrafluoroethylene) which is a fluorine-based resin, PP (polypropylene), PE (polyethylene), and the like are included. The hole diameter of the mesh filter can be selected in accordance with the particle diameter of the particles to be filtered. The ink for forming a functional layer is filtered by pressure-injecting into the capsule type filter.

The results of measurement of the particles after filtering the ink for forming a functional layer using the filter having a hole diameter of 0.2 μm are shown in FIG. 10. Practically, 110 ml of the ink for forming a functional layer was filtered by the filter, the ink for forming a functional layer after filtering was set to a sample, and the measurement was performed by using the in-liquid particle counter KS-42A described above. As shown in FIG. 10, 123,363 particles having a particle diameter of 0.1 μm or more, 118,575 particles having a particle diameter of 0.15 μm or more, 96,588 particles having a particle diameter of 0.2 μm or more, 5,218 particles having a particle diameter of 0.3 μm or more, and 559 particles having a particle diameter of 0.5 μm or more were included in 10 ml of the ink for forming a functional layer after filtering. That is, even if the filtration is conducted by using the filter having a hole diameter of 0.2 μm which is smaller than a hole diameter of 0.5 μm in order to remove the particles having a particle diameter of 0.5 μm or more, 559 particles having a particle diameter of 0.5 μm or more are included in the ink for forming a functional layer after filtering.

Therefore, a plurality of organic EL apparatuses 100 (samples) were manufactured by way of trial using the ink for forming a functional layer after filtering with the filter having a hole diameter of 0.2 μm and an occurrence status of the dark spot (DS) was verified. Specifically, a plurality of organic EL elements 130R were formed using the ink for forming a functional layer after filtering and the relation between an occurrence status of the dark spot (DS) and the particles (the foreign substances) was examined.

As described above, the area (the area of the luminescence region) of the film forming region of the organic EL element 130 in the organic EL apparatus 100 (the number of pixels is 15,105) of the trial product is approximately 27,197 μm². In addition, the ink 60 for forming the hole injection layer, the ink 70 for forming the hole transport layer, and the ink 80R for forming the luminescence layer, which are used for forming one organic EL element 130R based on the method of manufacturing the organic EL element described above, are respectively 420 ng, 384 ng, and 297 ng, and the total becomes 1,101 ng. Therefore, the total amount of ink used for forming a plurality of the organic EL elements 130R is 1,101 ng×15,105≈16.6 mg, that is, approximately 16 ml.

As a result of confirming a plurality of trial products, the average of the number which became the dark spot (DS) due to the particles (the foreign substances) having a size of 0.5 μm or more was 1.4. That is, since 16 ml of the ink for forming a functional layer is used in manufacturing of a plurality of organic EL elements 130R in the trial products, it is considered that 1.4 (0.16%) became the dark spot (DS) among 894 which is the number of the particles (559) having a particle diameter of 0.5 μm or more measured by the in-liquid particle counter (KS-42A) of 1.6 times. It is considered that the particles which does not become the dark spot (DS), for example, which are generated due to not completely dissolving the functional layer forming material in a solvent exist in the particles having a particle diameter of 0.5 μm or more measured by the in-liquid particle counter. In other words, the particles which can become the dark spot (DS) indicate the solid content which is an impurity included in the ink for forming a functional layer and is not dissolved in a solvent.

Figure 11A:
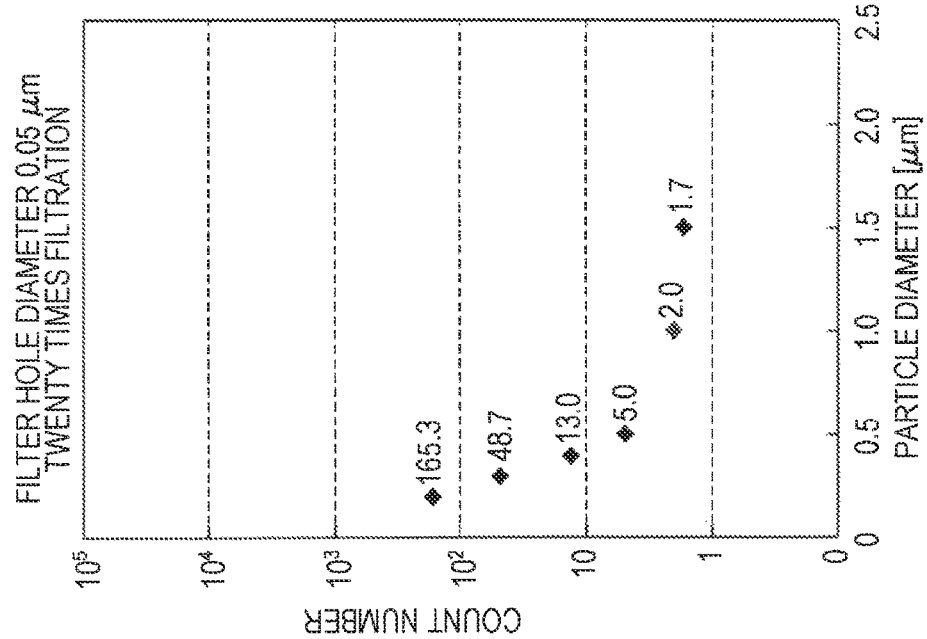
FIG. 11A is a graph showing a result of measurement of particles after an ink for forming a functional layer is filtered twice using a filter having a hole diameter of 0.05 μm
Figure 11B:
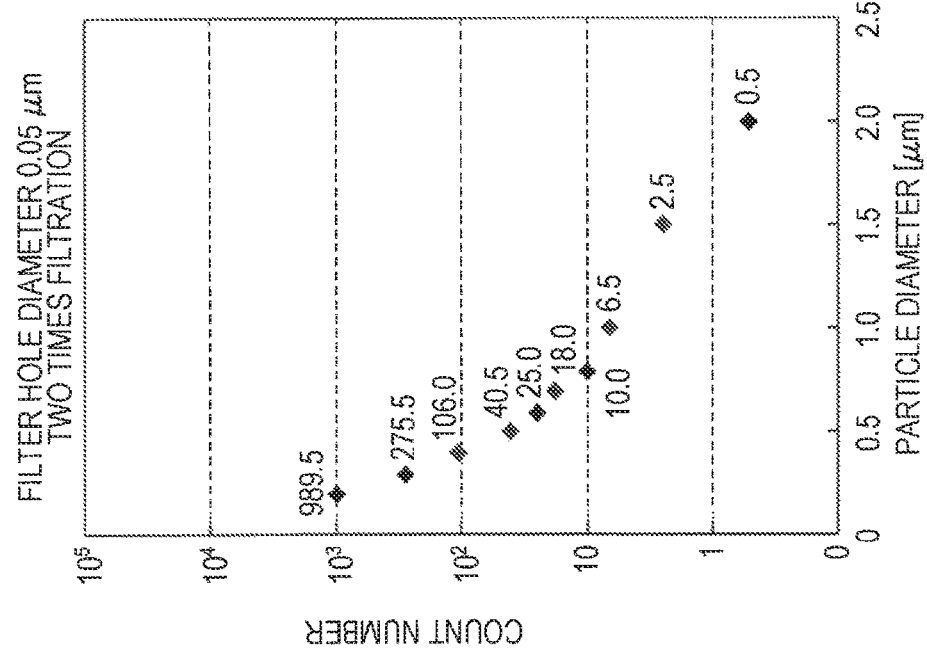
FIG. 11B is a graph showing a result of measurement of particles after filtering 20 times.

The hole diameter of filter and the number of times of filtration were verified in order to further reduce the particles included in the ink for forming a functional layer. Specifically, the particles of the ink for forming a functional layer after the filtration was performed using the filter of 0.05 μm in which the hole diameter is even smaller were measured by using the in-liquid particle counter (KS-42BF; the minimum diameter of the particles capable of being detected is 0.2 μm). The results of measurement are shown in FIGS. 11A and 11B. FIG. 11A is a graph showing a result of measurement of particles after the ink for forming a functional layer is filtered twice using the filter having a hole diameter of 0.05 μm and FIG. 11B is a graph showing a result of measurement of particles after filtering 20 times. Moreover, as to the number of the particles in the graphs, the average value of measurements taken several times was displayed to one decimal place.

As shown in FIG. 11A, 989.5 particles having a particle diameter of 0.2 μm or more, 275.5 particles having a particle diameter of 0.3 μm or more, 106 particles having a particle diameter of 0.4 μm or more, 40.5 particles having a particle diameter of 0.5 μm or more, 25 particles having a particle diameter of 0.6 μm or more, 18 particles having a particle diameter of 0.7 μm or more, 10 particles having a particle diameter of 0.8 μm or more, 6.5 particles having a particle diameter of 1.0 μm or more, 2.5 particles having a particle diameter of 1.5 μm or more, and 0.5 particles having a particle diameter of 2.0 μm or more were included in the ink for forming a functional layer after filtering twice using the filter having a hole diameter of 0.05 μm.

For example, in the organic EL apparatus 100 in which the number of pixels is 8K4K (55 inch) described above, the total area of the film forming region becomes 2,932 μm$^2$× 7,680×4,320=97,276 cm$^2$, and thus approximately 3,792 ml of the ink which is the amount of 237 times with respect to the trial product of 3 inch described above is used. Therefore, even if the ink for forming a functional layer after filtering twice is used, it is estimated that 40.5×3,792/10=15,357 of the particles of 0.5 μm or more exist in 3,792 ml of the ink, and among those, 24 particles which are equivalent to 0.16% become the unallowable dark spot (DS), and thus the defective pixels are generated. Since the number of the unallowable dark spot (DS), that is, the number of the defective pixel becomes less than 5 by setting the number of the particles of 0.5 μm or more in 10 ml of the ink for forming a functional layer to 7 or less, it is considered as a level that can be accepted as a quality assurance level in manufacturing the actual product.

As shown in FIG. 11B, 165.3 particles having a particle diameter of 0.2 μm or more, 48.7 particles having a particle diameter of 0.3 μm or more, 13 particles having a particle diameter of 0.4 μm or more, 5 particles having a particle diameter of 0.5 μm or more, 2 particles having a particle diameter of 1.0 μm or more, and 1.7 particles having a particle diameter of 1.5 μm were included in the ink for forming a functional layer after filtering 20 times using the filter having a hole diameter of 0.05 μm. Therefore, in a case where the organic EL apparatus 100 in which the number of pixels is 8K4K (55 inch) described above is manufactured using the ink for forming a functional layer in this state, it is estimated that 5×3,792/10=1,896 of the particles of 0.5 μm or more exist in 3,792 ml of the ink, and among those, 3 particles which are equivalent to 0.16% become the unallowable dark spot (DS). That is, when the filtration is performed approximately 20 times using the filter having a hole diameter of 0.05 μm, it is possible to supply the ink for forming a functional layer with durability sufficient to withstand practical use. Therefore, in order to set the number of the defective pixels in which a decrease in brightness is recognized to less than 5, it is preferable to set the number of the particles having a particle diameter of 0.5 μm or more included in 10 ml of the ink for forming a functional layer to 7 or less. In addition, while it is considered that the probability in which the foreign substances are redundantly included in the same pixel 107 is practically, considerably low in consideration with a response to the finer pixel size (for example, the number of pixels is 8K4K) or forming, for example, the hole injection layer 132a or the hole transport layer 132b other than the luminescence layer among the functional layers 132 consisting of a plurality of thin film layers by the liquid phase process, it is more preferable to set the number of the particles having a particle diameter of 0.5 μm or more included in 10 ml of the ink for forming a functional layer to less than 1.

Such a method of manufacturing the ink for forming a functional layer has a first process of measuring the size and the number of the particles included in the ink for forming a functional layer after mixing (before filtering) per unit volume (10 ml), a second process of selecting a hole diameter of a filter based on a result of the first process, and the third process of filtering the ink for forming a functional layer using the filter having a hole diameter selected in the second process. Then, in the second process, it is preferable to select the hole diameter of the filter from the relation between the hole diameter of the filter and the number of the particles having a size of 0.5 μm or more after filtering.

In addition, in the second process, it is preferable to determine the hole diameter of the filter and the number of times of filtration so that the number of particles of 0.5 μm or more is 7 or less in 10 ml of the ink for forming a functional layer after filtering. Furthermore, it is more preferable to determine the hole diameter of the filter and the number of times of filtration so that the number of particles of 0.5 μm or more is less than 1 in 10 ml of the ink for forming a functional layer after filtering.

In doing so, it is possible to manufacture the ink for forming a functional layer in which the size and the number of the particles are controlled.

Moreover, in the third process in which the ink for forming a functional layer is filtered, the filtration may repeatedly be performed by using the filters having the same hole diameter or the filtration may repeatedly be performed while reducing the hole diameter step by step by using the filters having different hole diameters. It is preferable to filter with the filter having a bigger hole diameter first and then to filter by switching to the filter having a smaller hole diameter in consideration with the time taken to filter.

In addition, in the method of manufacturing the organic EL element 130 described above, as a configuration of a discharge apparatus in which the ink for forming a functional layer is discharged from the ink jet head 50 as a droplet, it is considered to arrange the filters having different hole diameters in series to a supply passage of the ink for forming a functional layer to the ink jet head 50.

The invention is not limited to the embodiment described above and can appropriately be changed in a range which is not contrary to the gist or the idea of the invention understood from the scope of claims and the entire specification, and an ink for forming a functional layer, a method of manufacturing the ink for forming a functional layer, and a method of manufacturing an organic EL element to which the ink for forming a functional layer is applied, in accordance with such changes are also included in a technical scope of the invention. Various Modification Examples are considered in addition to the embodiment described above. Hereinafter, description will be given by giving Modification Examples.

MODIFICATION EXAMPLE 1

The organic EL element to which the ink for forming a functional layer of the invention can be applied is not limited to one having the luminescence layer 132cR (or the luminescence layer 132cG) and the luminescence layer 132cB between the pixel electrode 131 as an anode and the counter electrode 134 as a cathode. The luminescence layer formed by the liquid phase process may be one layer or at least one layer of thin film layer among a plurality of thin film layers configuring the functional layer 132 may be formed using the ink for forming a functional layer.

MODIFICATION EXAMPLE 2

An element in which the ink for forming a functional layer of the invention and the method of manufacturing the same can be applied is not limited to the organic EL element. For example, a microoptical element such as an organic semiconductor element, a structure of MEMS, or microlense, and the like are included.

Therefore, the configuration of the functional layer forming material included in the ink for forming a functional layer or the solvent for dissolving the functional layer forming material is not limited to the configurations of the inks 60, 70, 80G, and 80R as the ink for forming a functional layer described above. In addition, in a case where the ink for forming a functional layer is applied using the ink jet head 50 (in a case where the liquid droplet discharging method is used), in order to prevent an occurrence of clogging by drying the ink for forming a functional layer in a nozzle of the ink jet head 50, it is preferable that the boiling point of the solvent for dissolving the functional layer forming material be 200° C. or higher. Furthermore, in order to stably discharge a droplet of the ink for forming a functional layer from a nozzle using the ink jet head 50, it is preferable that the viscosity of the ink for forming a functional layer be 30 mPa·s (second) or less.

The entire disclosure of Japanese Patent Application No. 2013-238595, filed Nov. 19, 2013 is expressly incorporated by reference herein.

What is claimed is:

1. A method of manufacturing an ink for forming a functional layer, the ink including a functional material and a solvent for dissolving the functional material, the method comprising:

measuring a size and an amount of solid contents included in the ink, the solid contents being not dissolved in the solvent;

selecting a filter having a hole diameter based on the size and amount of the measured solid contents;

filtering the ink using the filter having the hole diameter, wherein the measuring, selecting and filtering are performed repeatedly until the amount of solid contents having a predetermined size or more is less than a predetermined number, in a second or subsequent selecting, the hole diameter is selected based on a relationship between the hole diameter selected in the previous selecting and the amount of solid contents having a predetermined size or more, the hole diameter is selected so as to be less than the hole diameter selected in the previous selecting, and the hole diameter and a number of times of filtration are determined so that a number of the solid contents having a size of 0.5 μm or more is 7 or less in 10 ml of the ink after filtering.

2. The method of manufacturing an ink for forming a functional layer according to claim 1, wherein in the measuring, the size and amount of solid contents are measured a plurality of times.

3. A method of manufacturing an organic electro-luminescence element provided with a functional layer consisting of a plurality of thin film layers between an anode and a cathode and having a luminescence function, the method comprising forming any thin film layer among the plurality of thin film layers using an ink for forming a functional layer formed according to the method of claim 1.

4. A method of manufacturing an organic electro-luminescence element provided with a functional layer consisting of a plurality of thin film layers between an anode and a cathode and having a luminescence function, the method comprising forming any thin film layer among the plurality of thin film layers using an ink for forming a functional layer formed according to the method of claim 2.

5. The method of manufacturing an ink for forming a functional layer according to claim 1, wherein the size and the amount of solid contents included in the ink are measured before the ink is filtered.

6. The method of manufacturing an ink for forming a functional layer according to claim 1, wherein the size and the amount of solid contents included in the ink are measured using a light scattering system.

* * * * *